United States Patent
Luo

(10) Patent No.: US 11,037,958 B2
(45) Date of Patent: Jun. 15, 2021

(54) ARRAY SUBSTRATE AND MANUFACTURING METHOD THEREOF

(71) Applicant: TCL China Star Optoelectronics Technology Co., Ltd., Guangdong (CN)

(72) Inventor: Chuanbao Luo, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/617,939

(22) PCT Filed: Aug. 28, 2019

(86) PCT No.: PCT/CN2019/102976
§ 371 (c)(1),
(2) Date: Nov. 27, 2019

(87) PCT Pub. No.: WO2020/228180
PCT Pub. Date: Nov. 19, 2020

(65) Prior Publication Data
US 2020/0411567 A1 Dec. 31, 2020

(30) Foreign Application Priority Data
May 14, 2019 (CN) .......................... 201910398245.7

(51) Int. Cl.
*H01L 27/00* (2006.01)
*H01L 29/00* (2006.01)
*H01L 27/12* (2006.01)

(52) U.S. Cl.
CPC ........ *H01L 27/1225* (2013.01); *H01L 27/127* (2013.01)

(58) Field of Classification Search
CPC .............. H01L 27/1225; H01L 27/127; H01L 27/1214; H01L 27/3262; H01L 27/1251;
(Continued)

(56) References Cited

U.S. PATENT DOCUMENTS 8,405,085 B2 * 3/2013 Wu .................... H01L 29/78621
257/59
8,598,577 B2 * 12/2013 Park .................... H01L 27/1214
257/43
(Continued)

FOREIGN PATENT DOCUMENTS

| CN | 102403363 A | 4/2012 |
|---|---|---|
| CN | 104704638 A | 6/2015 |

(Continued)

*Primary Examiner* — Nikolay K Yushin
(74) *Attorney, Agent, or Firm* — Hamre, Schumann, Mueller & Larson, P.C.

(57) ABSTRACT

The present invention provides an array substrate and manufacturing method thereof. The array substrate includes a thin film transistor including a gate, an active layer, a gate insulation layer, a source, and a drain. The active layer includes a first active layer and a second active layer laminated with one another, and material of the first active layer and the second active layer are different, to increase the on-state current of the thin film transistor. The present invention increases the on-state current by reducing a contact barrier with the gate insulation layer or reducing a depletion area of the active layer.

11 Claims, 6 Drawing Sheets

(58) Field of Classification Search
CPC ........... H01L 29/7869; H01L 29/66969; H01L 29/78696
See application file for complete search history.

(56) References Cited

U.S. PATENT DOCUMENTS

| | | | |
|---|---|---|---|
| 2012/0139043 A1* | 6/2012 | Wu | H01L 29/78621 257/347 |
| 2014/0103337 A1 | 4/2014 | Yamazaki et al. | |
| 2017/0263783 A1 | 9/2017 | Yamazaki et al. | |
| 2018/0013003 A1 | 1/2018 | Yamazaki | |
| 2019/0386083 A1 | 12/2019 | Liu | |

FOREIGN PATENT DOCUMENTS

| | | |
|---|---|---|
| CN | 107611085 A | 1/2018 |
| TW | 201813095 A | 4/2018 |

\* cited by examiner

ARRAY SUBSTRATE AND MANUFACTURING METHOD THEREOF

FIELD OF INVENTION

The disclosure relates to the display technology field, and more particularly, to an array substrate and manufacturing method thereof.

BACKGROUND OF INVENTION

In recent year, metal oxide thin film transistors, represented by amorphous indium gallium zinc oxide (IGZO), are widely used due to its advantages, such as high resolution, large size, high frame rate processing, and high transmittance in the visible range, etc.

Because display panels tend toward high resolution and large size, thin film transistors of display panel need higher on-state current; however, the on-state current of present thin film transistors is too small, which cannot meet the requirements of the display panel.

Thus, the present thin film transistors have technical problem that the on-state current is too small and need to be improved.

SUMMARY OF INVENTION

The present invention discloses an array substrate and manufacturing method thereof, to resolve the technical problem that the on-state current of the present thin film transistor is too small.

To achieve the above the technical problem, the present disclosure provides the technical schemes as below.

The present disclosure provides an array substrate comprises a thin film transistor, the thin film transistor comprises a gate, an active layer comprising a first active layer and a second active layer laminated with one another, materials of the first active layer and the second active layer are different for increasing the on-state current of the thin film transistor, a gate insulation layer disposed between the gate and the active layer, a source electrically connected to the active layer, and a drain electrically connected to the active layer.

In the array substrate of the present disclosure, the first active layer is disposed on one side of the gate insulation layer away from the gate, the second active layer is disposed on one side of the first active layer away from the gate insulation layer, and an ion doping concentration of the first active layer is greater than an ion doping concentration of the second active layer for reducing a depletion area of the active layer.

In the array substrate of the present disclosure, the first active layer is disposed on one side of the gate insulation layer away from the gate, the second active layer is disposed on one side of the first active layer away from the gate insulation layer, and an ion doping concentration of the second active layer is greater than an ion doping concentration of the first active layer.

In the array substrate of the present disclosure, the active layer comprises a third active layer, the third active layer is disposed on one side of the second active layer away from the first active layer, and an ion doping concentration of the third active layer is greater than an ion doping concentration of the second active layer.

In the array substrate of the present disclosure, the active layer comprises a fourth active layer, the fourth active layer is disposed on one side of the second active layer away from the first active layer, and an ion doping concentration of the fourth active layer is less than an ion doping concentration of the second active layer for reducing a depletion area of the active layer.

In the array substrate of the present disclosure, the active layer comprises a fifth active layer, the fifth active layer is disposed on one side of the fourth active layer away from the second active layer, and an ion doping concentration of the fifth active layer is greater than an ion doping concentration of the fourth active layer.

In the array substrate of the present disclosure, the first active layer is disposed on one side of the gate insulation layer away from the gate, the second active layer is disposed on one side of the first active layer away from the gate insulation layer, and the first active layer is a wide band gap semiconductor material for reducing a contact barrier with the gate insulation layer, and the second active layer is a metal oxide.

In the array substrate of the present disclosure, the first active layer comprises a gallium oxide layer or a tungsten oxide layer.

In the array substrate of the present disclosure, the first active layer comprises a gallium oxide layer and a tungsten oxide layer laminated with one another.

In the array substrate of the present disclosure, the active layer comprises a sixth active layer, the sixth active layer is disposed on one side of the second active layer away from the first active layer, and an ion doping concentration of the second active layer is less than an ion doping concentration of the sixth active layer.

In the array substrate of the present disclosure, the active layer comprises a seventh active layer, the seventh active layer is disposed on one side of the second active layer away from the first active layer, and an ion doping concentration of the seventh active layer is less than an ion doping concentration of the second active layer for reducing a depletion area of the active layer.

In the array substrate of the present disclosure, the active layer comprises an eighth active layer, the eighth active layer is disposed on one side of the seventh active layer away from the second active layer, and an ion doping concentration of the eighth active layer is greater than an ion doping concentration of the seventh active layer.

In the array substrate of the present disclosure, the active layer comprises a ninth active layer, the ninth active layer is disposed on one side of the seventh active layer away from the second active layer, and an ion doping concentration of the ninth active layer is less than an ion doping concentration of the seventh active layer for reducing a depletion area of the active layer.

In the array substrate of the present disclosure, the active layer comprises a tenth active layer, the tenth active layer is disposed on one side of the ninth active layer away from the second active layer, and an ion doping concentration of the tenth active layer is greater than an ion doping concentration of the ninth active layer.

The present disclosure further provides a manufacturing method of the array substrate comprises manufacturing a gate, forming a gate insulation on one side of the gate, and forming an active layer on one side of the insulation layer away from the gate, the active layer comprises a first active layer and a second active layer laminated with one another, materials of the first active layer and the second active layer are different, to increase the on-state current of the thin film transistor, and forming a source and a drain, the source and the drain electrically connected to the active layer.

In the array substrate of manufacturing method in the present disclosure, the step of forming an active layer on one side of the insulation layer away from the gate comprises forming the first active layer on one side of the gate insulation layer away from the gate, forming the second active layer on one side of the first active layer away from the gate insulation layer, and an ion doping concentration of the first active layer is greater than an ion doping concentration of the second active layer for reducing a depletion area of the active layer.

In the array substrate of manufacturing method in the present disclosure, the step of forming an active layer on one side of the insulation layer away from the gate comprises forming a third active layer on one side of the second active layer away from the first active layer, and an ion doping concentration of the third active layer is greater than an ion doping concentration of the second active layer.

In the array substrate of manufacturing method in the present disclosure, the step of forming an active layer on one side of the insulation layer away from the gate comprises forming a fourth active layer on one side of the second active layer away from the first active layer, and an ion doping concentration of the fourth active layer is less than an ion doping concentration of the second active layer for reducing a depletion area of the active layer.

In the array substrate of manufacturing method in the present disclosure, the step of forming an active layer on one side of the insulation layer away from the gate comprises forming a fifth active layer on one side of the fourth active layer away from the first active layer, and an ion doping concentration of the fifth active layer is greater than an ion doping concentration of the fourth active layer.

In the array substrate of manufacturing method in the present disclosure, the step of forming an active layer on one side of the insulation layer away from the gate comprises forming the first active layer on one side of the gate insulation layer away from the gate, forming the second active layer on one side of the first active layer away from the gate insulation layer, and the first active layer is a wide band gap semiconductor material for reducing a contact barrier with the gate insulation layer, and the second active layer is a metal oxide.

The advantageous effect of the present disclosure is that the present invention provides an array substrate and manufacturing method thereof. The array substrate includes a thin film transistor including a gate, an active layer, a gate insulation layer, a source, and a drain. The active layer includes a first active layer and a second active layer laminated with one another, and materials of the first active layer and the second active layer are different, to increase the on-state current of the thin film transistor. The gate insulation layer is disposed between the gate and the active layer, and the source and the drain are couple to the active layer. The active layer is disposed as a first active layer and a second active layer different in material, increasing the on-state current of the thin film transistor, to resolve the technical problem that the on-state current of the present thin film transistor is too small.

Further, an ion doping concentration of the first active layer is set to be greater than an ion doping concentration of the second active layer, which reduces a depletion area of the active layer and increases the on-state current of the thin film transistor, or the first active layer is set to be a wide band gap materials and the second active layer is set to be a metal oxide, which reduces the contact barrier between the active layer and the gate insulation layer, and can also increase the on-state current of the thin film transistor.

DESCRIPTION OF DRAWINGS

In order to more clearly illustrate the technical solutions of the embodiments of the present invention, the drawings used in the description of the embodiments will be briefly described as below, apparently, the drawings described as below are just some embodiments of the present invention, for the person having ordinary skill in the art, under the premise of no creative labor, the other drawings also can be obtained according to these drawings.

DETAILED DESCRIPTION OF PREFERRED EMBODIMENTS

The following description of the embodiments with reference to the appended drawings is used for illustrating specific embodiments which may be used for carrying out the present disclosure. The directional terms described by the present disclosure, such as "upper", "lower", "front", "back", "left", "right", "inner", "outer", "side", etc., are only directions by referring to the accompanying drawings. Thus, the adopted directional terms are used to describe and understand the present disclosure, but the present disclosure is not limited thereto. In figures, elements with similar structures are indicated by the same numbers.

The present invention discloses an array substrate and manufacturing method thereof, to resolve the technical problem that the on-state current of the present thin film transistor is too small.

Figure 1:
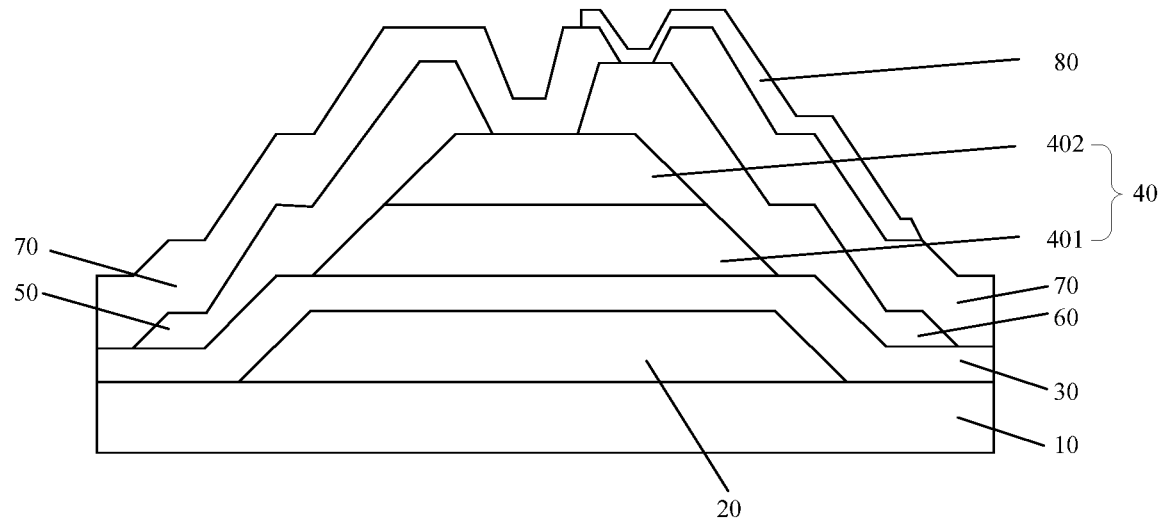
FIG. 1 is a first schematic structural diagram of an array substrate provided by the embodiment of the present disclosure.

As shown as FIG. 1, FIG. 1 is a first schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

The substrate 10 is usually glass or other materials, and is not limited thereto. The gate 20 is formed on the substrate 10, material of the gate 20 may be metal material, such as Cu, Al, Ti, Ta, W, Mo, and Cr.

The gate insulation layer 30 is formed on the gate 20 and covers the gate 20 and the substrate 10. Material of the gate insulation layer 30 is generally SiOx, SiNx, SiON, or a sandwich structure of the three.

The active layer 40 is formed on the gate insulation layer 30 and insulated from the gate 20. The active layer 40 comprises a first active layer 401 and a second active layer 402 laminated with one another.

In one embodiment, the active layer 40 is deposited on the gate insulation layer 30 by magnetron sputtering, metal organic chemical vapor deposition (MOCVD) or pulsed laser deposition (PLD).

After the deposition of the active layer 40 is completed, annealing treatment is performed. In one embodiment, it may be annealed in a dry air atmosphere at 400° C. for about 0.5 hours.

Materials of the first active layer 401 and the second active layer 402 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture.

In one embodiment, the first active layer 401 and the second active layer 402 have the same material composition and both are IGZO, but an ion doping concentration of the first active layer 401 and an ion doping concentration of the second active layer 402 are different, and thus belongs to different materials.

An ion doping concentration of the first active layer 401 is greater than an ion doping concentration of the second active layer 402, in the present embodiment, the doped ions are oxygen ions, but the present disclosure is not limited thereto. Since the oxygen ions and the oxygen vacancies are neutralized in the area where the first active layer 401 and the second active layer 402 are in contact, a depletion area is generated. The depletion area hinders the transmission of carriers, thus when an ion doping concentration of the first active layer 401 is greater than an ion doping concentration of the second active layer 402, excess oxygen ions can reduce the formation of oxygen vacancy defects in the area where the first active layer 401 and the second active layer 402 are in contact, which reduces a depletion area and the resistor of electron tunneling, and increase the on-state current of the thin film transistor.

An ion doping concentration of the first active layer 401 and the second active layer 402 may be adjusted by controlling the ratio of argon to oxygen at the time of film formation, or using target sputtering for differences in ion doping concentration.

The source 50 and the drain 60 are formed on the active layer 40 and electrically connected to the active layer 40.

The passivation layer 70 is formed on the source 50 and the drain 60, material of the passivation layer 70 may be SiOx, SiNx, or a sandwich structure of the two, and penetrating to the drain 60 by via hole.

The pixel electrode 80 is formed on the passivation layer 70 and connected to the drain 60 through via hole of the passivation layer 70.

Figure 2:
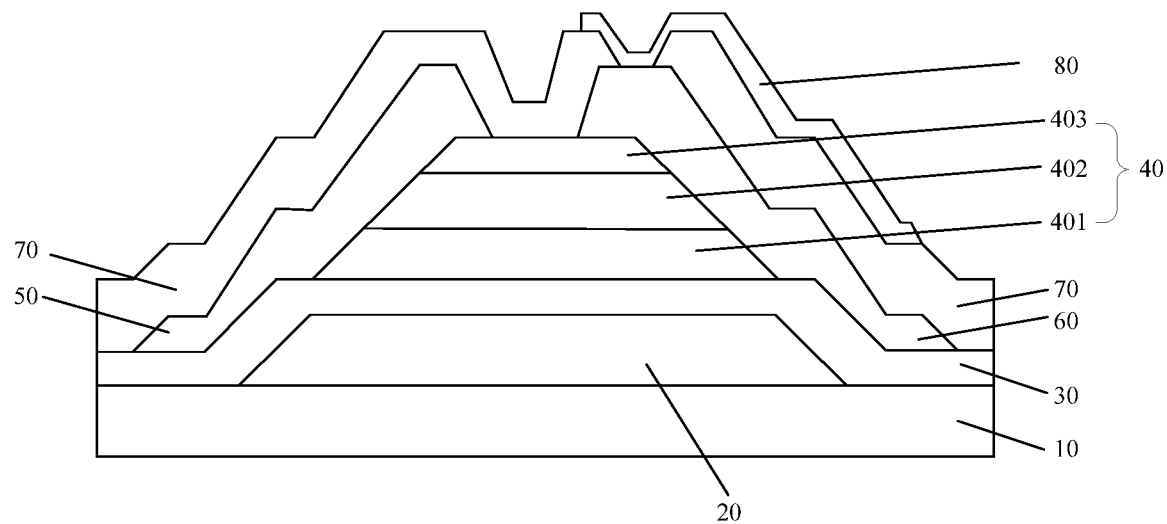
FIG. 2 is a second schematic structural diagram of the array substrate provided by the embodiment of the present disclosure.

As shown as FIG. 2, FIG. 2 is a second schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In one embodiment, the active layer 40 comprises a first active layer 401, a second active layer 402, and a third active layer 403 laminated with one another.

Materials of the first active layer 401, the second active layer 402, and the third active layer 403 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, Materials of the first active layer 401, the second active layer 402, and the third active layer 403 are all IGZO.

An ion doping concentration of the first active layer 401 is greater than an ion doping concentration of the second active layer 402, which can reduce the formation of oxygen vacancy defects in the area where the first active layer 401 and the second active layer 402 are in contact, which reduces a depletion area and the resistor of electron tunneling, and increase the on-state current of the thin film transistor.

An ion doping concentration of the third active layer 403 is greater than an ion doping concentration of the second active layer 402, which can inhibit the adsorption or desorption of the doped ions by the active layer 40, namely, an ion doping concentration of the active layer 40 may be ensured to be stable state.

In the present embodiment, the doped ions are oxygen ions, but the disclosure is not limited thereto.

An ion doping concentration of the first active layer 401, the second active layer 402, and the third active layer 403 may be adjusted by controlling the ratio of argon to oxygen at the time of film formation, or using target sputtering for differences in ion doping concentration.

Figure 3:
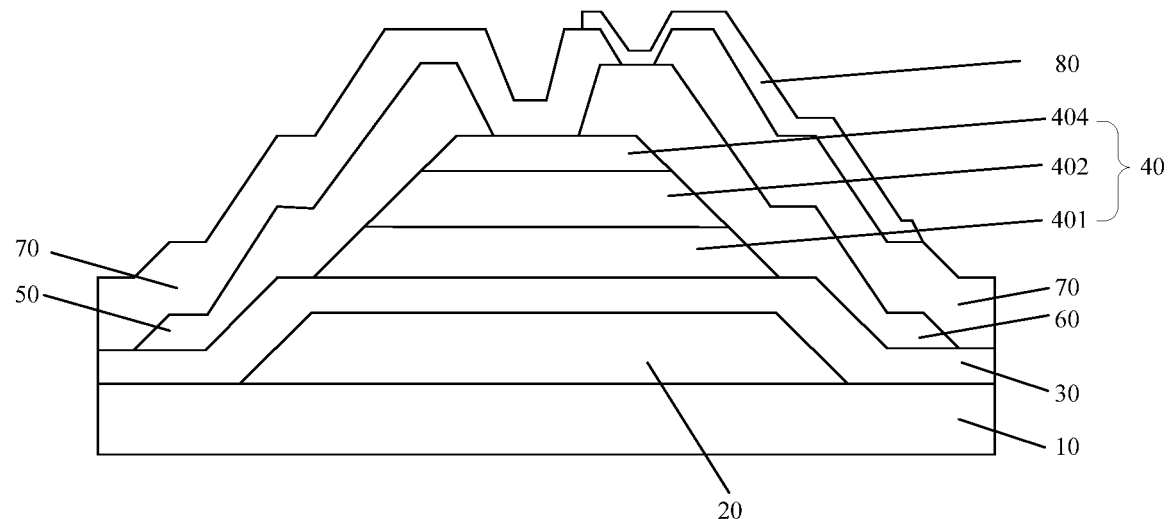
FIG. 3 is a third schematic structural diagram of the array substrate provided by the embodiment of the present disclosure.

As shown as FIG. 3, FIG. 3 is a third schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In the present embodiment, the active layer 40 comprises a first active layer 401, a second active layer 402, and a fourth active layer 404 laminated with one another.

Materials of the first active layer 401, the second active layer 402, and the fourth active layer 404 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, Materials of the first active layer 401, the second active layer 402, and the fourth active layer 404 are all IGZO.

An ion doping concentration of the first active layer 401 is greater than an ion doping concentration of the second active layer 402, an ion doping concentration of the second active layer 402 is greater than an ion doping concentration of the fourth active layer 404, namely, the first active layer 401, the second active layer 402, and the fourth active layer 404 are formed a certain oxygen concentration gradient, and an ion doping concentration decreases from bottom to top.

An ion doping concentration of the first active layer 401 is greater than an ion doping concentration of the second active layer 402, which can reduce the formation of oxygen vacancy defects in the area where the first active layer 401 and the second active layer 402 are in contact, which reduces a depletion area and the resistor of electron tunneling, and increase the on-state current of the thin film transistor.

An ion doping concentration of the second active layer 402 is greater than an ion doping concentration of the fourth active layer 404, which can reduce the formation of oxygen vacancy defects in the area where the second active layer 402 and the fourth active layer 404 are in contact, which reduces a depletion area and the resistor of electron tunneling, and increase the on-state current of the thin film transistor.

In the present embodiment, the doped ions are oxygen ions, but the disclosure is not limited thereto.

An ion doping concentration of the first active layer 401, the second active layer 402, and the fourth active layer 404 may be adjusted by controlling the ratio of argon to oxygen at the time of film formation, or using target sputtering for differences in ion doping concentration.

Figure 4:
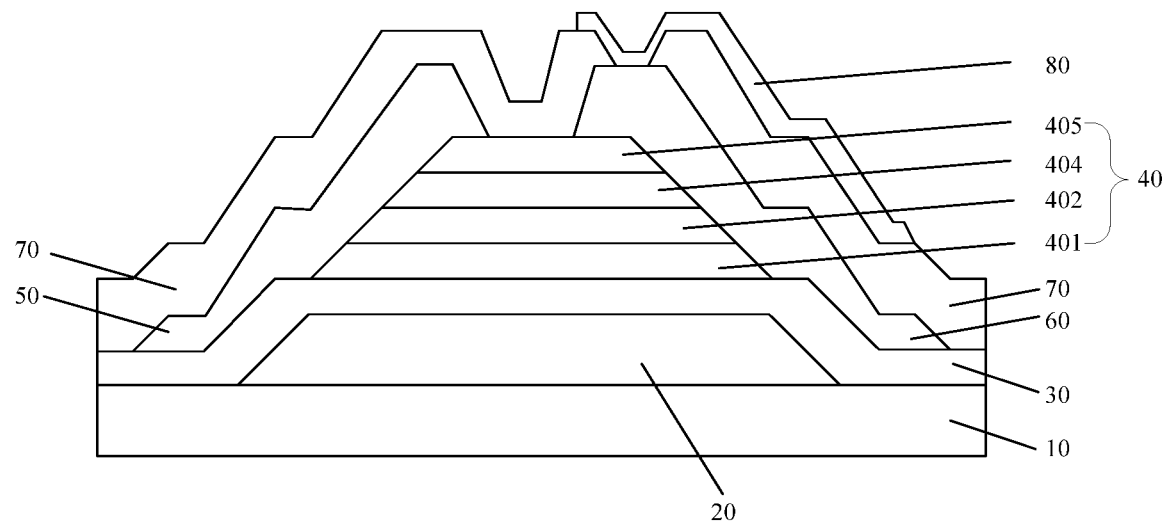
FIG. 4 is a fourth schematic structural diagram of the array substrate provided by the embodiment of the present disclosure.

As shown as FIG. 4, FIG. 4 is a fourth schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In the present embodiment, the active layer 40 comprises a first active layer 401, a second active layer 402, a fourth active layer 404, and a fifth active layer 405 laminated with one another.

Materials of the first active layer 401, the second active layer 402, the fourth active layer 404, and the fifth active layer 405 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, Materials of the first active layer 401, the second active layer 402, the fourth active layer 404, and the fifth active layer 405 are all IGZO.

An ion doping concentration of the first active layer 401 is greater than an ion doping concentration of the second active layer 402, an ion doping concentration of the second active layer 402 is greater than an ion doping concentration of the fourth active layer 404, namely, the first active layer 401, the second active layer 402, and the fourth active layer 404 are formed a certain oxygen concentration gradient, and an ion doping concentration decreases from bottom to top.

An ion doping concentration of the first active layer 401 is greater than an ion doping concentration of the second active layer 402, which can reduce the formation of oxygen vacancy defects in the area where the first active layer 401 and the second active layer 402 are in contact, which reduces a depletion area and the resistor of electron tunneling and increase the on-state current of the thin film transistor.

An ion doping concentration of the second active layer 402 is greater than an ion doping concentration of the fourth active layer 404, which can reduce the formation of oxygen vacancy defects in the area where the second active layer 402 and the fourth active layer 404 are in contact, which reduces a depletion area and the resistor of electron tunneling and increase the on-state current of the thin film transistor.

An ion doping concentration of the fifth active layer 405 is greater than an ion doping concentration of the second active layer 402, which can inhibit the adsorption or desorption of the doped ions by the active layer 40, namely, an ion doping concentration of the active layer 40 may be ensured to be stable state.

In the present embodiment, the doped ions are oxygen ions, but the disclosure is not limited thereto.

An ion doping concentration of the first active layer 401, the second active layer 402, the fourth active layer 404, and the fifth active layer 405 may be adjusted by controlling the ratio of argon to oxygen at the time of film formation, or using target sputtering for differences in ion doping concentration.

Figure 5:
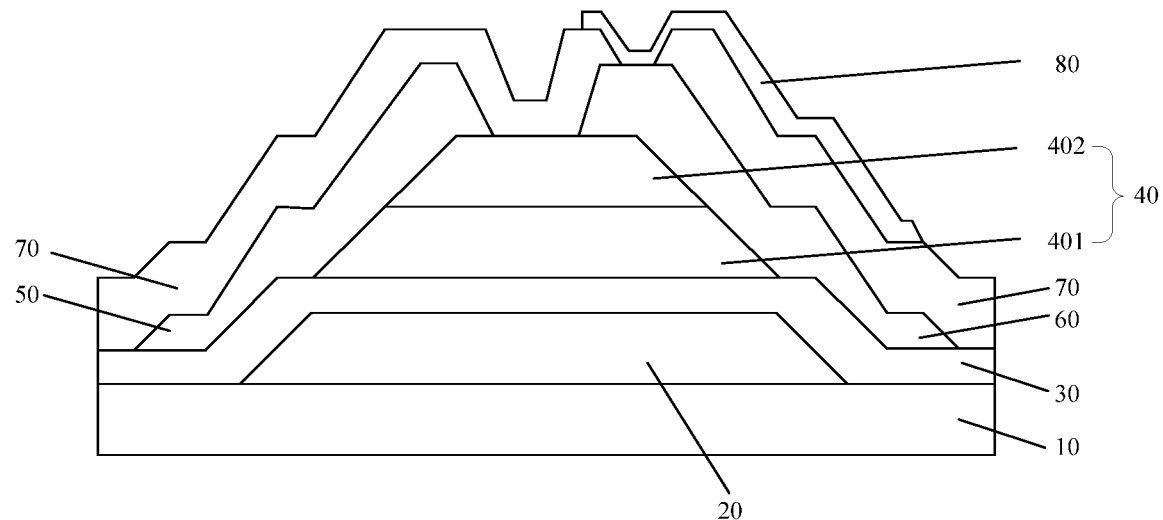
FIG. 5 is a fifth schematic structural diagram of the array substrate provided by the embodiment of the present disclosure.

As shown as FIG. 5, FIG. 5 is a fifth schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In the present embodiment, the active layer 40 comprises a first active layer 401 and a second active layer 402 laminated with one another. The first active layer 401 and the second active layer 402 have the different material composition.

Material of the first active layer 401 is wide band gap materials, such as $Ga_2O_3$ or $WO_3$. Since the gate insulator layer 30 is an insulator, the forbidden band of the insulator is the widest, and the source 50 and the drain 60 are metal, and the forbidden band width of the metal material is the smallest, so the first active layer 401 in contact with the gate insulation layer 30 is made of a material that is wide band gap. And the forbidden band width is between the insulator and the metal, which can reduce the contact barrier between the gate insulation layer 30 and the first active layer 401, corresponding to the transition of a contact barrier exists between the gate insulation layer 30, the source 50, and the drain 60, thereby increasing the on-state current of the thin film transistor.

In one embodiment, the first active layer 401 is single layer structure, such as may be $Ga_2O_3$ layer or $WO_3$ layer.

In one embodiment, the first active layer 401 is double layer structure, such as may be $Ga_2O_3$ layer and $WO_3$ layer laminated with one another.

Material of the second active layer 402 is selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, material of the second active layer 402 is IGZO.

Figure 6:
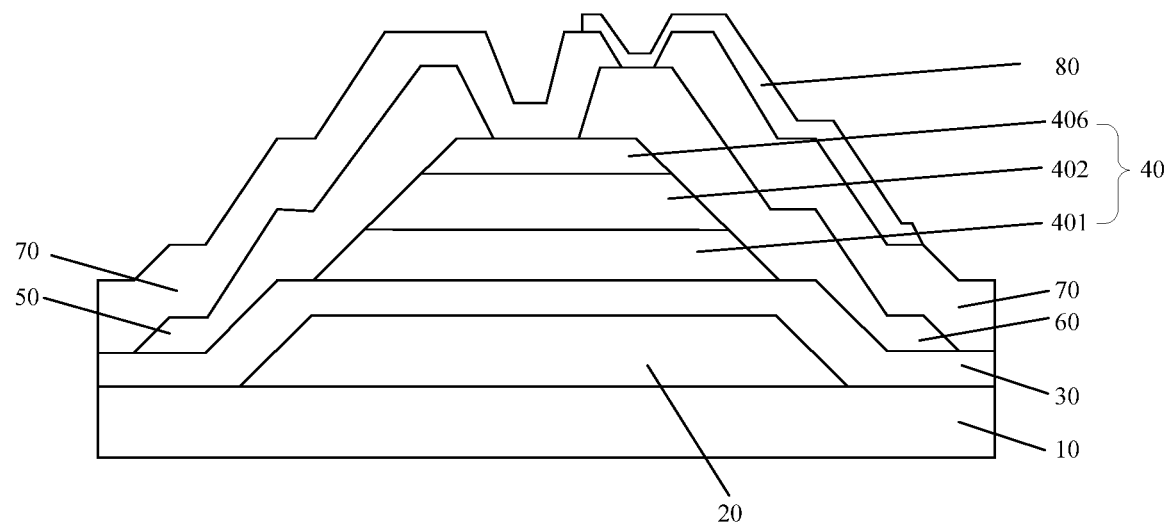
FIG. 6 is a sixth schematic structural diagram of the array substrate provided by the embodiment of the present disclosure.

As shown as FIG. 6, FIG. 6 is a sixth schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In the present embodiment, the active layer 40 comprises a first active layer 401, a second active layer 402, and a sixth active layer 406 laminated with one another.

Material of the first active layer 401 is wide band gap materials, such as $Ga_2O_3$ or $WO_3$. Wide band gap materials can reduce the contact barrier with the gate insulation layer 30, thereby increasing the on-state current of the thin film transistor circuit.

In one embodiment, the first active layer 401 is single layer structure, such as may be $Ga_2O_3$ layer or $WO_3$ layer.

In one embodiment, the first active layer 401 is double layer structure, such as may be $Ga_2O_3$ layer and $WO_3$ layer laminated with one another.

Materials of the second active layer 402 and the sixth active layer 406 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, materials of the second active layer 402 and the sixth active layer 406 both are IGZO.

An ion doping concentration of the sixth active layer 406 is greater than an ion doping concentration of the second active layer 402, which can inhibit the adsorption or desorption of the doped ions by the active layer 40, namely, an ion doping concentration of the active layer 40 may be ensured to be stable state.

In the present embodiment, the doped ions are oxygen ions, but the disclosure is not limited thereto.

An ion doping concentration of the second active layer 402 and the sixth active layer 406 may be adjusted by controlling the ratio of argon to oxygen at the time of film formation, or using target sputtering for differences in ion doping concentration.

Figure 7:
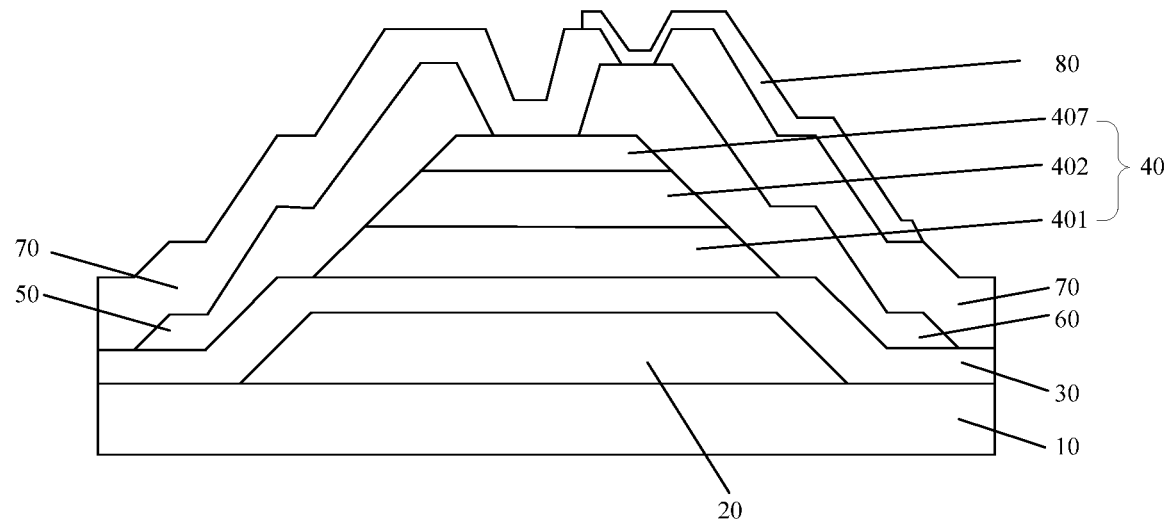
FIG. 7 is a seventh schematic structural diagram of the array substrate provided by the embodiment of the present disclosure.

As shown as FIG. 7, FIG. 7 is a seventh schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In the present embodiment, the active layer 40 comprises a first active layer 401, a second active layer 402, and a seventh active layer 407 laminated with one another.

Material of the first active layer 401 is wide band gap materials, such as $Ga_2O_3$ or $WO_3$. Wide band gap materials can reduce the contact barrier with the gate insulation layer 30, thereby increasing the on-state current of the thin film transistor circuit.

In one embodiment, the first active layer 401 is single layer structure, such as may be $Ga_2O_3$ layer or $WO_3$ layer.

In one embodiment, the first active layer 401 is double layer structure, such as may be $Ga_2O_3$ layer and $WO_3$ layer laminated with one another.

Materials of the second active layer 402 and the seventh active layer 407 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, materials of the second active layer 402 and the seventh active layer 407 both are IGZO.

An ion doping concentration of the second active layer 402 is greater than an ion doping concentration of the seventh active layer 407, which can reduce the formation of oxygen vacancy defects in the area where the second active layer 402 and the fourth seventh layer 407 are in contact, which reduces a depletion area and the resistor of electron tunneling and increase the on-state current of the thin film transistor.

In the present embodiment, the doped ions are oxygen ions, but the disclosure is not limited thereto.

An ion doping concentration of the second active layer 402 and the seventh active layer 407 may be adjusted by controlling the ratio of argon to oxygen at the time of film formation, or using target sputtering for differences in ion doping concentration.

Figure 8:
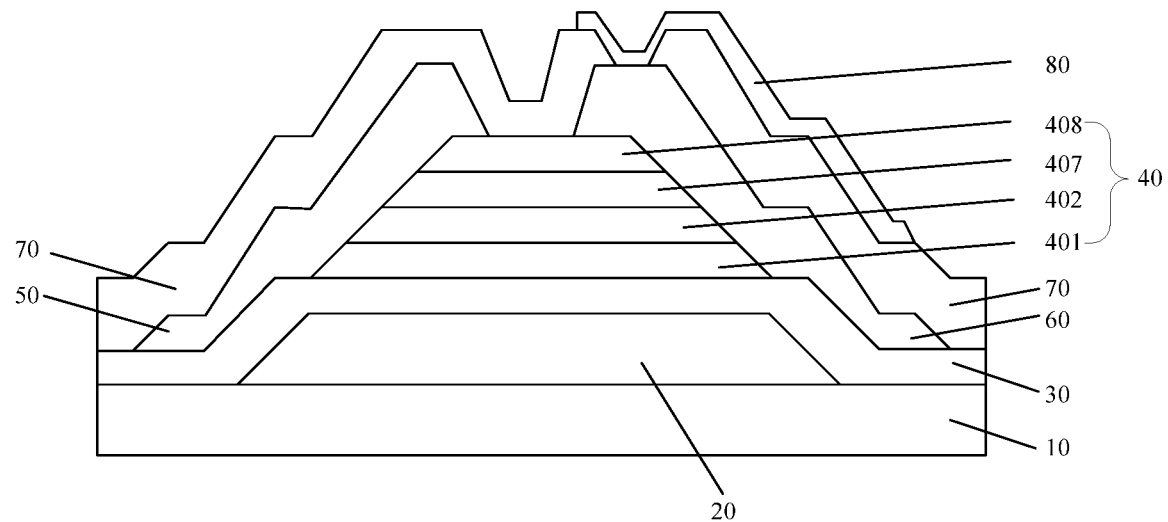
FIG. 8 is an eighth schematic structural diagram of the array substrate provided by the embodiment of the present disclosure.

As shown as FIG. 8, FIG. 8 is an eighth schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In the present embodiment, the active layer 40 comprises a first active layer 401, a second active layer 402, a seventh active layer 407, and an eighth active layer 408 laminated with one another.

Material of the first active layer 401 is wide band gap materials, such as $Ga_2O_3$ or $WO_3$. Wide band gap materials can reduce the contact barrier with the gate insulation layer 30, thereby increasing the on-state current of the thin film transistor circuit.

In one embodiment, the first active layer 401 is single layer structure, such as may be $Ga_2O_3$ layer or $WO_3$ layer.

In one embodiment, the first active layer 401 is double layer structure, such as may be $Ga_2O_3$ layer and $WO_3$ layer laminated with one another.

Materials of the second active layer 402, the seventh active layer 407, and the eighth active layer 408 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, materials of the second active layer 402, the seventh active layer 407, and the eighth active layer 408 are all IGZO.

An ion doping concentration of the seventh active layer 407 is less than an ion doping concentration of the second active layer 402, thus, which can reduce the formation of oxygen vacancy defects in the area where the second active layer 402 and the fourth seventh layer 407 are in contact, which reduces a depletion area and the resistor of electron tunneling and increase the on-state current of the thin film transistor.

An ion doping concentration of the eighth active layer 408 is greater than an ion doping concentration of the seventh active layer 407, which can inhibit the adsorption or desorption of the doped ions by the active layer 40, namely, an ion doping concentration of the active layer 40 may be ensured to be stable state.

In the present embodiment, the doped ions are oxygen ions, but the disclosure is not limited thereto.

An ion doping concentration of the second active layer 402, the seventh active layer 407 and the eighth active layer 408 may be adjusted by controlling the ratio of argon to oxygen at the time of film formation, or using target sputtering for differences in ion doping concentration.

Figure 9:
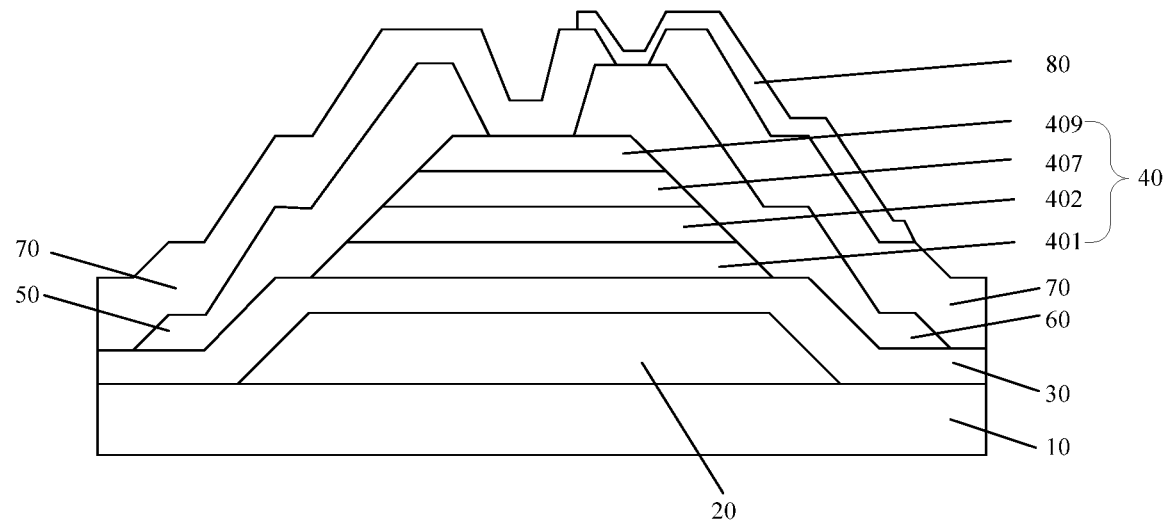
FIG. 9 is a ninth schematic structural diagram of the array substrate provided by the embodiment of the present disclosure.

As shown as FIG. 9, FIG. 9 is a ninth schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In the present embodiment, the active layer 40 comprises a first active layer 401, a second active layer 402, a seventh active layer 407, and a ninth active layer 409 laminated with one another.

Material of the first active layer 401 is wide band gap materials, such as $Ga_2O_3$ or $WO_3$. Wide band gap materials can reduce the contact barrier with the gate insulation layer 30, thereby increasing the on-state current of the thin film transistor circuit.

In one embodiment, the first active layer 401 is single layer structure, such as may be $Ga_2O_3$ layer or $WO_3$ layer.

In one embodiment, the first active layer 401 is double layer structure, such as may be $Ga_2O_3$ layer and $WO_3$ layer laminated with one another.

Materials of the second active layer 402, the seventh active layer 407, and the ninth active layer 409 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, materials of the second active layer 402, the seventh active layer 407 and the ninth active layer 409 are all IGZO.

An ion doping concentration of the second active layer 402 is greater than an ion doping concentration of the seventh active layer 407, an ion doping concentration of the seventh active layer 407 is greater than an ion doping concentration of the ninth active layer 409, namely, the second active layer 402, the seventh active layer 407, and the ninth active layer 409 are formed a certain oxygen concentration gradient, and an ion doping concentration decreases from bottom to top.

An ion doping concentration of the second active layer 402 is greater than an ion doping concentration of the seventh active layer 407, which can reduce the formation of oxygen vacancy defects in the area where the second active layer 402 and the seventh active layer 407 are in contact, which reduces a depletion area and the resistor of electron tunneling and increase the on-state current of the thin film transistor.

An ion doping concentration of the seventh active layer 407 is greater than an ion doping concentration of the ninth active layer 409, which can reduce the formation of oxygen vacancy defects in the area where the seventh active layer 407 and the ninth active layer 409 are in contact, which reduces a depletion area and the resistor of electron tunneling and increase the on-state current of the thin film transistor.

In the present embodiment, the doped ions are oxygen ions, but the disclosure is not limited thereto.

An ion doping concentration of the second active layer 402, the seventh active layer 407, and the ninth active layer 409 may be adjusted by controlling the ratio of argon to oxygen at the time of film formation, or using target sputtering for differences in ion doping concentration.

Figure 10:
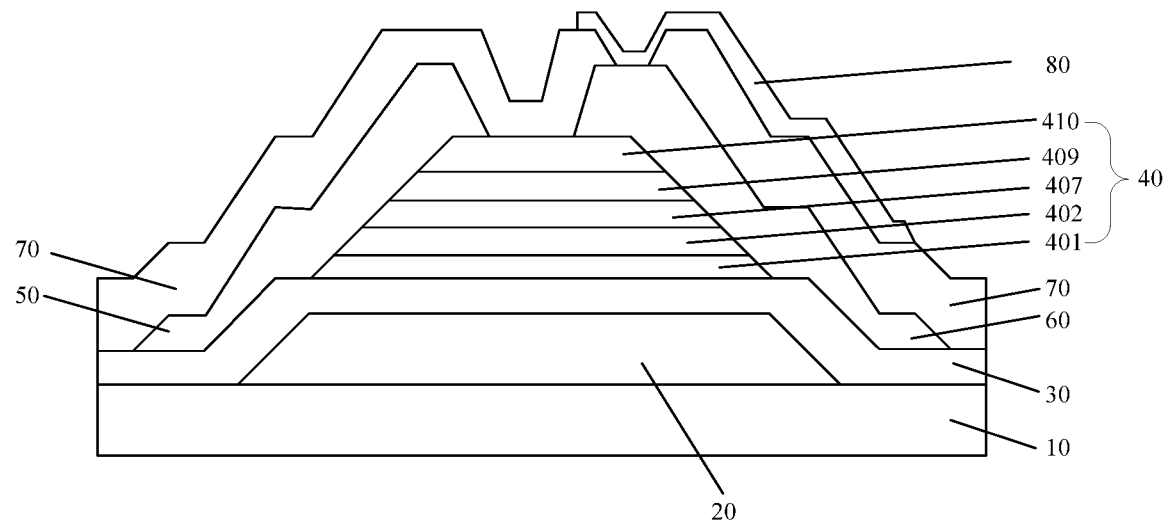
FIG. 10 is a tenth schematic structural diagram of the array substrate provided by the embodiment of the present disclosure.

As shown as FIG. 10, FIG. 10 is a tenth schematic structural diagram of the array substrate provided by the embodiment of the present disclosure, comprising a thin film transistor. The thin film transistor comprises a substrate 10, a gate 20, a gate insulation layer 30, an active layer 40, a source 50, a drain 60, a passivation layer 70, and a pixel electrode 80 which are laminated from bottom to top.

In the present embodiment, the active layer 40 comprises a first active layer 401, a second active layer 402, a seventh active layer 407, a ninth active layer 409, and a tenth active layer 410 laminated with one another.

Material of the first active layer 401 is wide band gap materials, such as $Ga_2O_3$ or $WO_3$. Wide band gap materials can reduce the contact barrier with the gate insulation layer 30, thereby increasing the on-state current of the thin film transistor circuit.

In one embodiment, the first active layer 401 is single layer structure, such as may be $Ga_2O_3$ layer or $WO_3$ layer.

In one embodiment, the first active layer 401 is double layer structure, such as may be $Ga_2O_3$ layer and $WO_3$ layer laminated with one another.

Materials of the second active layer 402, the seventh active layer 407, the ninth active layer 409, and the tenth active layer 410 are selected from indium gallium zinc oxide (IGZO), zinc oxide (ZnO), indium zinc oxide (IZO), gallium zinc oxide (GaZnO), zinc tin oxide (ZTO), indium tin oxide (ITO), and one of the groups of its mixture. In the present embodiment, materials of the second active layer 402, the seventh active layer 407, the ninth active layer 409, and the tenth active layer 410 are all IGZO.

An ion doping concentration of the second active layer 402 is greater than an ion doping concentration of the seventh active layer 407, an ion doping concentration of the seventh active layer 407 is greater than an ion doping concentration of the ninth active layer 409, namely, the second active layer 402, the seventh active layer 407, and the ninth active layer 409 are formed a certain oxygen concentration gradient, and an ion doping concentration decreases from bottom to top.

An ion doping concentration of the second active layer 402 is greater than an ion doping concentration of the seventh active layer 407, which can reduce the formation of oxygen vacancy defects in the area where the second active layer 402 and the seventh active layer 407 are in contact, which reduces a depletion area and the resistor of electron tunneling and increase the on-state current of the thin film transistor.

An ion doping concentration of the seventh active layer 407 is greater than an ion doping concentration of the ninth active layer 409, which can reduce the formation of oxygen vacancy defects in the area where the seventh active layer 407 and the ninth active layer 409 are in contact, which reduces a depletion area and the resistor of electron tunneling and increase the on-state current of the thin film transistor.

An ion doping concentration of the tenth active layer 410 is greater than an ion doping concentration of the ninth active layer 409, which can inhibit the adsorption or desorption of the doped ions by the active layer 40, namely, an ion doping concentration of the active layer 40 may be ensured to be stable state.

In the present embodiment, the doped ions are oxygen ions, but the disclosure is not limited thereto.

An ion doping concentration of the second active layer 402, the seventh active layer 407, the ninth active layer 409, and the tenth active layer 410 may be adjusted by controlling the ratio of argon to oxygen at the time of film formation, or using target sputtering for differences in ion doping concentration.

The thin film transistors of the array substrate in FIG. 1 to FIG. 10 are all back channel etched metal oxide thin film transistors and bottom gate structures, but the present disclosure is equally applicable to top gate type metal oxide thin film transistors.

Figure 11:
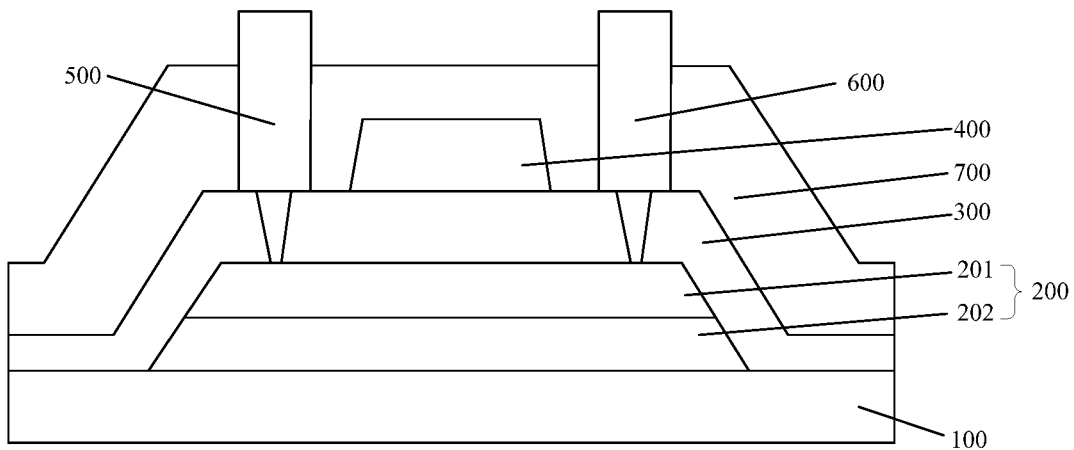
FIG. 11 is an eleventh schematic structural diagram of the array substrate provided by the embodiment of the present disclosure.

As shown as FIG. 11, FIG. 11 is an eleventh schematic structural diagram of the array substrate provided by the embodiment of the present disclosure, comprising a thin film transistor. The thin film transistor comprises a substrate 100, an active layer 200 formed on the substrate 100, a gate insulation layer 300 formed on the active layer 200, a gate 400 formed on the gate insulation layer 300, a source 500 and a drain 600 formed on the gate 400, and an interlayer insulation 700 formed on the source 500 and the drain 600 which are laminated from bottom to top, wherein, the source 500 and the drain 600 are connected to the active layer 200 by different via holes.

The active layer 200 is formed on the substrate 100 and insulated from the gate 400. The active layer 200 comprises a first active layer 201 and a second active layer 202 laminated with one another, the first active layer 401 is disposed on one side of the gate insulation layer 300 away from the gate 400, the second active layer 202 is disposed on one side of the first active layer 201 away from the gate insulation layer 300.

The first active layer 201 and the second active layer 202 may be different ion doping concentrations but materials having the same composition, or may be materials having different compositions.

In one embodiment, materials of the first active layer 201 and the second active layer 202 both are IGZO, but an ion doping concentration of the first active layer 201 is greater than an ion doping concentration of the second active layer 202, thus, which can reduce the formation of oxygen vacancy defects in the area where the first active layer 201 and the second active layer 202 are in contact, reducing a depletion area and the resistor of electron tunneling and increasing the on-state current of the thin film transistor. In one embodiment, the doped ions are oxygen ions.

In one embodiment, material of the first active layer 201 is wide band gap materials, such as $Ga_2O_3$ or $WO_3$. Wide band gap materials can reduce the contact barrier with the gate insulation layer 300, thereby increasing the on-state current of the thin film transistor circuit. Material of the second active layer 202 is IGZO.

The structure of the active layer 200 is not limited thereto, and the film layer structure of the active layer 40 in FIG. 1 to FIG. 10 is applicable to the top gate type metal oxide thin film transistor in the present embodiment.

However, it should be noted that the present disclosure is not limited thereto, and is applicable to an etching barrier metal oxide thin film transistor.

The present disclosure further provides a display panel, which comprises the array substrate described in any of the above embodiments. The display panel may be a liquid crystal display (LCD) display panel or an organic light emitting diode (OLED) display panel.

Figure 12:
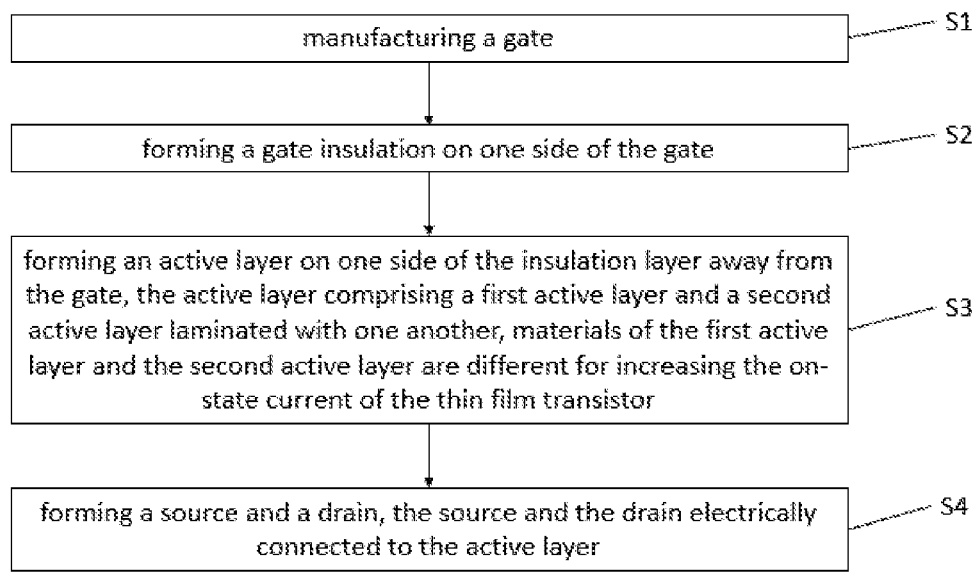
FIG. 12 is a flowchart of manufacturing method of array substrate provided by the embodiment of the present disclosure.

As shown as FIG. 12, the embodiment of the present disclosure further provides a manufacturing method of array substrate comprises steps as below.

S1: manufacturing a gate.

S2: forming a gate insulation on one side of the gate.

S3: forming an active layer on one side of the insulation layer away from the gate, the active layer comprising a first active layer and a second active layer laminated with one another, materials of the first active layer and the second active layer are different, to increase the on-state current of the thin film transistor.

S4: forming a source and a drain, the source and the drain electrically connected to the active layer.

The following description is further described according to FIG. 1 to FIG. 10.

In the step S1, the substrate 10 is first provided. The substrate 10 is usually a glass substrate, and may also be a substrate of other materials, which is not limited thereto. Then, a gate 20 is formed on the substrate 10, and the gate 20 is first formed on the substrate 10 by a physical vapor deposition method, and then a patterned gate is formed by a photolithography process.

Material of the gate 20 may be metal material, such as Cu, Al, Ti, Ta, W, Mo, and Cr.

In the step S2, the gate insulation layer 30 is formed on the gate 20 by chemical vapor deposition, and then annealed in a dry air atmosphere at 400° C. Material of the gate insulation layer 30 is generally SiOx, SiNx, SiON, or a sandwich structure of the three.

In the step S3, the active layer 40 is deposited on the gate insulation layer 30 by magnetron sputtering, metal organic chemical vapor deposition (MOCVD) or pulsed laser deposition (PLD).

After the deposition of the active layer 40 is completed, annealing treatment is performed. In one embodiment, it may be annealed in a dry air atmosphere at 400° C. for about 0.5 hours.

After the annealing process is completed, the active layer 40 is etched by a wet etching process or a dry etching process using oxalic acid as an etching solution. After the etching process, the entire metal oxide thin film is patterned to form an island-shaped metal oxide semiconductor layer.

The first active layer 401 is formed on gate insulation layer 30, the second active layer 402 is formed the first active layer 401. The first active layer 401 and the second active layer 402 are different materials. The first active layer 401 and the second active layer 402 may be different ion doping concentrations but materials having the same composition, or may be materials having different compositions.

As shown as FIG. 1 to FIG. 5, materials of the first active layer 401 and the second active layer 402 both are IGZP, but the first active layer 401 and the second active layer 402 may be adjusted by controlling the ratio of argon to oxygen at the time of film formation, or using target sputtering for differences in ion doping concentration. An ion doping concentration of the first active layer 401 is greater than an ion doping concentration of the second active layer 402, which can reduce the formation of oxygen vacancy defects in the first active layer 401 and reduce a depletion area and the resistor of electron tunneling, and increase the on-state current of the thin film transistor.

When material of the first active layer 401 is IGZO, in one embodiment, as shown as FIG. 2, a third active layer 403 may also be formed on the second active layer 402. The third active layer 403 is deposited on the second active layer 402 by magnetron sputtering, metal organic chemical vapor deposition or pulsed laser evaporation. An ion doping concentration of the third active layer 403 is greater than an ion doping concentration of the second active layer 402, which can inhibit the adsorption or desorption of the doped ions by the active layer 40, namely, an ion doping concentration of the active layer 40 may be maintained in a preset state.

In one embodiment, as shown as FIG. 3, a fourth active layer 404 may also be formed on the second active layer 402. The fourth active layer 404 is deposited on the second active layer 402 by magnetron sputtering, metal organic chemical vapor deposition or pulsed laser evaporation. An ion doping concentration of the fourth active layer 404 is less than an ion doping concentration of the second active layer 402, which can further decrease the on-state current of the thin film transistor.

In one embodiment, as shown as FIG. 4, a fifth active layer 405 may also be formed on the fourth active layer 404. The fifth active layer 405 is deposited on the fourth active layer 404 by magnetron sputtering, metal organic chemical vapor deposition or pulsed laser evaporation. An ion doping concentration of the fifth active layer 405 is greater than an ion doping concentration of the fourth active layer 404, which can inhibit the adsorption or desorption of the doped ions by the active layer 40, namely, an ion doping concentration of the active layer 40 may be ensured to be stable state.

As shown as FIG. 6 to FIG. 10, materials of the first active layer 401 and the second active layer 402 are different composition. Material of the first active layer 201 is wide band gap materials, such as $Ga_2O_3$ or $WO_3$. Wide band gap materials can reduce the contact barrier with the gate insulation layer 30, thereby increasing the on-state current of the thin film transistor circuit.

In one embodiment, the first active layer 401 is single layer structure, such as may be Ga$_2$O$_3$ layer or WO$_3$ layer.

In one embodiment, the first active layer 401 is double layer structure, such as may be Ga$_2$O$_3$ layer and WO$_3$ layer laminated with one another.

Material of the second active layer 402 is IGZO.

In one embodiment, as shown as FIG. 6, a sixth active layer 406 may also be formed on the second active layer 402. The sixth active layer 406 is deposited on the second active layer 402 by magnetron sputtering, metal organic chemical vapor deposition or pulsed laser evaporation. An ion doping concentration of the sixth active layer 406 is greater than an ion doping concentration of the second active layer 402, which can inhibit the adsorption or desorption of the doped ions by the active layer 40, namely, an ion doping concentration of the active layer 40 may be maintained in a stable state.

In one embodiment, as shown as FIG. 7, a seventh active layer 407 may also be formed on the second active layer 402. The seventh active layer 407 is deposited on the second active layer 402 by magnetron sputtering, metal organic chemical vapor deposition or pulsed laser evaporation. An ion doping concentration of the seventh active layer 407 is less than an ion doping concentration of the second active layer 402, which can further increase the on-state current of the thin film transistor.

In one embodiment, as shown as FIG. 8, an eighth active layer 408 may also be formed on the seventh active layer 407. The eighth active layer 408 is deposited on the seventh active layer 407 by magnetron sputtering, metal organic chemical vapor deposition or pulsed laser evaporation. An ion doping concentration of the eighth active layer 408 is greater than an ion doping concentration of the seventh active layer 407, which can inhibit the adsorption or desorption of the doped ions by the active layer 40, namely, an ion doping concentration of the active layer 40 may be maintained in a stable state.

In one embodiment, as shown as FIG. 9, a ninth active layer 409 may also be formed on the seventh active layer 407. The ninth active layer 409 is deposited on the seventh active layer 407 by magnetron sputtering, metal organic chemical vapor deposition or pulsed laser evaporation. An ion doping concentration of the ninth active layer 409 is less than an ion doping concentration of the seventh active layer 407, which can further increase the on-state current of the thin film transistor In one embodiment, as shown as FIG. 10, a tenth active layer 410 may also be formed on the ninth active layer 409. The tenth active layer 410 is deposited on the ninth active layer 409 by magnetron sputtering, metal organic chemical vapor deposition or pulsed laser evaporation. An ion doping concentration of the tenth active layer 410 is greater than an ion doping concentration of the ninth active layer 409, which can inhibit the adsorption or desorption of the doped ions by the active layer 40, namely, an ion doping concentration of the active layer 40 may be maintained in a stable state.

In the step S4, the source 50 and the drain 60 are deposited on the active layer 40 by physical vapor deposition or magnetron sputtering, and are formed by wet etching using aluminate or copper acid as a chemical solution. The source 50 and the drain 60 are electrically connected to the active layer 40.

After the source 50 and the drain 60 are formed, a passivation layer 70 may be formed, and the passivation layer 70 is deposited on the source 50 and the drain 60 by chemical vapor deposition. Material of the passivation layer 70 may be SiOx, SiNx, or a sandwich structure of the two, then a via hole is formed to the drain 60 by dry etching.

An ITO is further deposited on the passivation layer 70 by physical vapor deposition or magnetron sputtering to form a pixel electrode layer. Then, the pixel electrode layer is formed by wet etching of an oxalic acid solution to form a pixel electrode pattern, and the pixel electrode pattern is connected to the drain electrode 60 through a via hole on the passivation layer 70.

In the manufacturing method of the array substrate provided by the embodiment of the present disclosure, the doped ions are all oxygen ions, but the disclosure is not limited thereto.

In the manufacturing method of the array substrate provided by the embodiment of the present disclosure, the thin film transistors of the array substrate are back channel etched metal oxide thin film transistors and bottom gate structures, but it should be noted that, the disclosure is not limited thereto, the present disclosure is equally applicable to top gate type metal oxide thin film transistors.

According to the above embodiments:

The present invention provides an array substrate and manufacturing method thereof. The array substrate includes a thin film transistor including a gate, an active layer, a gate insulation layer, a source, and a drain. The active layer includes a first active layer and a second active layer laminated with one another, and materials of the first active layer and the second active layer are different, to increase the on-state current of the thin film transistor. The gate insulation layer is disposed between the gate and the active layer, and the source and the drain are couple to the active layer. The active layer is disposed as a first active layer and a second active layer different in material, increasing the on-state current of the thin film transistor, to resolve the technical problem that the on-state current of the present thin film transistor is too small.

Further, an ion doping concentration of the first active layer is set to be greater than an ion doping concentration of the second active layer, which reduces a depletion area of the active layer and increases the on-state current of the thin film transistor, or the first active layer is set to be a wide band gap materials and the second active layer is set to be a metal oxide, which reduces the contact barrier between the active layer and the gate insulation layer, and can also increase the on-state current of the thin film transistor.

As mentioned above, while the present disclosure has been disclosed via preferred embodiments as above, the preferred embodiments are not intended to limit the disclosure. Those skilled in the art can make various modifications and alternations without departing from the spirit and scope of the disclosure. The scope of protection of the disclosure is defined by the claims.

What is claimed is:

1. An array substrate comprising a thin film transistor, the thin film transistor comprising:

a gate;

an active layer comprising a first active layer, a second active layer, and a third active layer laminated with one another, materials of the first active layer and the second active layer are different for increasing an on-state current of the thin film transistor;

a gate insulation layer disposed between the gate and the active layer;

a source electrically connected to the active layer; and a drain electrically connected to the active layers;

wherein the first active layer is disposed on one side of the gate insulation layer away from the gate, the second active layer is disposed on one side of the first active layer away from the gate insulation layer, and an ion doping concentration of the first active layer is greater than an ion doping concentration of the second active layer for reducing a depletion area of the active layer; and the third active layer is disposed on one side of the second active layer away from the first active layer, and an ion doping concentration of the third active layer is greater than or less than the ion doping concentration of the second active layer.

2. The display panel as claimed in claim 1, wherein the active layer comprises a fourth active layer, the fourth active layer is disposed on one side of the third active layer away from the second active layer, the ion doping concentration of the third active layer is less than the ion doping concentration of the second active layer, and an ion doping concentration of the fourth active layer is greater than the ion doping concentration of the third active layer.

3. An array substrate comprising a thin film transistor, the thin film transistor comprising:
   a gate;
   an active layer comprising a first active layer and a second active layer laminated with one another, materials of the first active layer and the second active layer are different for increasing an on-state current of the thin film transistor;
   a gate insulation layer disposed between the gate and the active layer;
   a source electrically connected to the active layer; and
   a drain electrically connected to the active layer;
   wherein the first active layer is disposed on one side of the gate insulation layer away from the gate, the second active layer is disposed on one side of the first active layer away from the gate insulation layer, and the first active layer is a wide band gap semiconductor material for reducing a contact barrier with the gate insulation layer, and the second active layer is a metal oxide;
   wherein the first active layer comprises a gallium oxide layer, a tungsten oxide layer, or a gallium oxide layer and a tungsten oxide layer laminated with one another.

4. The array substrate as claimed in claim 3, wherein the active layer comprises a third active layer, the third active layer is disposed on one side of the second active layer away from the first active layer, and an ion doping concentration of the second active layer is less than an ion doping concentration of the third active layer.

5. The array substrate as claimed in claim 3, wherein the active layer comprises a third active layer, the third active layer is disposed on one side of the second active layer away from the first active layer, and an ion doping concentration of the third active layer is less than an ion doping concentration of the second active layer for reducing a depletion area of the active layer.

6. The array substrate as claimed in claim 5, wherein the active layer comprises a fourth active layer, the fourth active layer is disposed on one side of the third active layer away from the second active layer, and an ion doping concentration of the fourth active layer is greater than the ion doping concentration of the third active layer.

7. The array substrate as claimed in claim 5, wherein the active layer comprises a fourth active layer, the fourth active layer is disposed on one side of the third active layer away from the second active layer, and an ion doping concentration of the fourth active layer is less than the ion doping concentration of the third active layer for reducing the depletion area of the active layer.

8. The array substrate as claimed in claim 7, wherein the active layer comprises a fifth active layer, the fifth active layer is disposed on one side of the fourth active layer away from the second active layer, and an ion doping concentration of the fifth active layer is greater than the ion doping concentration of the fourth active layer.

9. A manufacturing method of an array substrate, comprising:
   manufacturing a gate;
   forming a gate insulation layer on one side of the gate;
   forming an active layer on one side of the gate insulation layer away from the gate, the active layer comprising a first active layer and a second active layer laminated with one another, materials of the first active layer and the second active layer are different for increasing an on-state current of a thin film transistor; and
   forming a source and a drain, the source and the drain electrically connected to the active layer;
   wherein the step of forming the active layer on the one side of the gate insulation layer away from the gate comprises: forming the first active layer on the one side of the gate insulation layer away from the gate, forming the second active layer on one side of the first active layer away from the gate insulation layer, and an ion doping concentration of the first active layer is greater than an ion doping concentration of the second active layer for reducing a depletion area of the active layer; and
   forming a third active layer on one side of the second active layer away from the first active layer, and an ion doping concentration of the third active layer is greater than or less than the ion doping concentration of the second active layer.

10. The manufacturing method of the array substrate as claimed in claim 9, wherein the step of forming the active layer on the one side of the gate insulation layer away from the gate comprises: forming a fourth active layer on one side of the third active layer away from the second active layer, the ion doping concentration of the third active layer is less than the ion doping concentration of the second active layer, and an ion doping concentration of the fourth active layer is greater than the ion doping concentration of the third active layer.

11. The manufacturing method of the array substrate as claimed in claim 9, wherein the first active layer is a wide band gap semiconductor material for reducing a contact barrier with the gate insulation layer, and the second active layer is a metal oxide.

* * * * *